United States Patent
Grosspietsch et al.

(10) Patent No.: US 6,822,523 B2
(45) Date of Patent: Nov. 23, 2004

(54) POWER MODULATOR AND METHOD OF OPERATING A POWER MODULATOR

(75) Inventors: John Grosspietsch, Libertyville, IL (US); Lawrence Cygan, Schaumburg, IL (US)

(73) Assignee: Motorola, Inc., Schaumburg, IL (US)

(*) Notice: Subject to any disclaimer, the term of this patent is extended or adjusted under 35 U.S.C. 154(b) by 0 days.

(21) Appl. No.: 10/230,679

(22) Filed: Aug. 28, 2002

(65) Prior Publication Data

US 2004/0043735 A1 Mar. 4, 2004

(51) Int. Cl.$^7$ ................................................ H03C 1/00
(52) U.S. Cl. .................................... 332/149; 332/150
(58) Field of Search ................................ 332/149, 150, 332/176, 178; 455/126, 127.1, 127.2; 330/10, 296, 297

(56) References Cited

U.S. PATENT DOCUMENTS 6,084,468 A * 7/2000 Sigmon et al. ............. 330/136
6,138,042 A   10/2000 Midya et al.
6,233,440 B1 * 5/2001 Taylor ....................... 455/127
6,449,467 B1 * 9/2002 Kingswood et al. ........ 455/127

FOREIGN PATENT DOCUMENTS

WO    WO 00/48306 A1    8/2000

* cited by examiner

*Primary Examiner*—Kenneth B. Wells
(74) *Attorney, Agent, or Firm*—Kenneth A. Haas

(57) ABSTRACT

To address the need for a power modulator that can efficiently operate within a wideband, high-speed communication system, a method and apparatus for power modulation is provided herein. In accordance with the preferred embodiment of the present invention an envelope reference signal is filtered in such a way that the bandwidth is reduced while keeping the instantaneous level of the filtered signal is greater than the unfiltered envelope level. Because the bandwidth of the envelope signal is reduced, efficient operation of the switching modulator can be achieved within wideband, high-speed communication systems.

10 Claims, 3 Drawing Sheets

200

POWER MODULATOR AND METHOD OF OPERATING A POWER MODULATOR

FIELD OF THE INVENTION

The present invention relates generally to power modulators and in particular to a power modulator and method of operating a power modulator.

BACKGROUND OF THE INVENTION

Switched-mode modulators are often used for power supply modulation in radio transmitters as a means to improve the efficiency of RF power amplifiers. In either the envelope tracking (ET) technique, or envelope elimination and restoration method (EER), an efficient switching power supply is used to vary the supply voltage of a power amplifier according to a time varying envelope signal. The power amplifier is operated at or near saturation, where its efficiency is optimal.

It is well known that the frequency of the switching power modulator must generally be at least 10 times the modulation bandwidth of the amplified signal so to accurately reproduce the envelope signal and ease filtering requirements. Where large signal bandwidths are used, the required switching rate may exceed that practically attainable, or may be high enough that significant switching losses are incurred.

In order to address this issue, prior art solutions have attempted to control the supply voltage using a combination of a switch-mode converter stage for gross power level control and a subsequent linear regulator stage for precise power envelope control. Such a prior-art solution is shown in FIG. 1 and described in detail in the International Application WO 00/48306 HIGH-EFFICIENCY AMPLIFIER AND BURST CONTROL. As shown in FIG. 1, amplifier 101 is preceded by linear regulator 103 and switching modulator (or switch-mode converter) 105. Although the above solution does allow for more efficient operation of amplifier 101, a problem exists in that for wideband, high-speed communications systems (e.g., those using orthogonal frequency division multiplexing (OFDM) modulation), the envelope bandwidth can be greater than the maximum useful switching frequencies of switch-mode tracking supplies. Therefore, a need exists for a power modulator that can efficiently operate within a wideband, high-bandwidth communication systems.

DETAILED DESCRIPTION OF THE DRAWINGS

To address the need for a switching power modulator that can efficiently operate within a wideband, high-speed communication system, a method and apparatus for power modulation is provided herein. In accordance with the preferred embodiment of the present invention an envelope reference signal is filtered in such a way that the bandwidth is reduced while keeping the instantaneous level of the filtered peak detector output signal greater than the unfiltered envelope level. Because the bandwidth of the envelope signal is reduced, efficient operation of the switching modulator can be achieved within wideband, high-speed communication systems.

The present invention encompasses a method for operating a power modulator. The method comprises the steps of receiving an envelope signal and outputting a square wave signal as the greater of the last K samples of the envelope signal. The square wave signal is then filtered and utilized to transform a fixed power source to a voltage that somewhat exceeds and approximates a desired power-amplifier operating voltage level.

The present invention additionally encompasses a power modulator comprising a peak detector having an envelope function as an input and outputting a square wave based on the envelope function and a switching modulator having the square wave as an input and outputting a voltage, based on the square wave, that somewhat exceeds and approximates a desired power-amplifier operating voltage.

The present invention additionally encompasses a power modulator comprising a peak detector having an envelope function as an input and outputting a square wave signal based on the envelope function, a filter having the square wave signal as an input and outputting a filtered square wave, and a switching modulator having the filtered square wave signal as an input and outputting a voltage, based on the filtered square wave signal, wherein the voltage somewhat exceeds and approximates a desired power-amplifier operating voltage.

The present invention additionally encompasses an apparatus comprising means for receiving an envelope signal and outputting a square wave signal as the greater of the last K samples of the envelope signal, means for filtering the square wave signal, and means for utilizing the filtered square wave to transform a fixed power source to a voltage that somewhat exceeds and approximates a desired power-amplifier operating voltage level.

Figure 1:
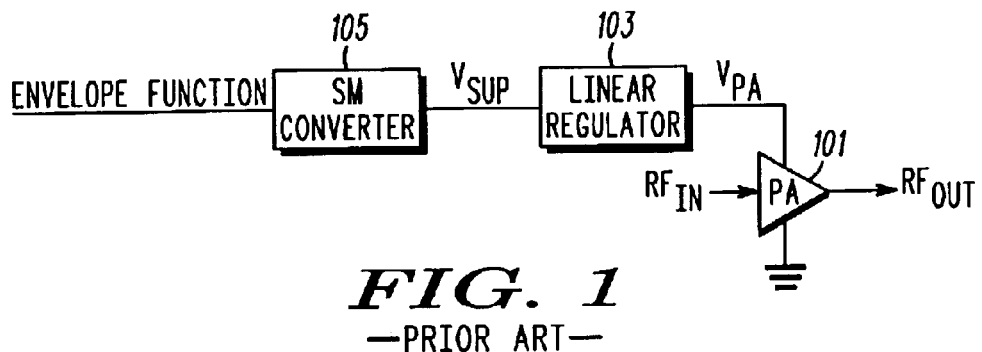
FIG. 1 is a block diagram of a prior-art power amplifier circuit.
Figure 2:
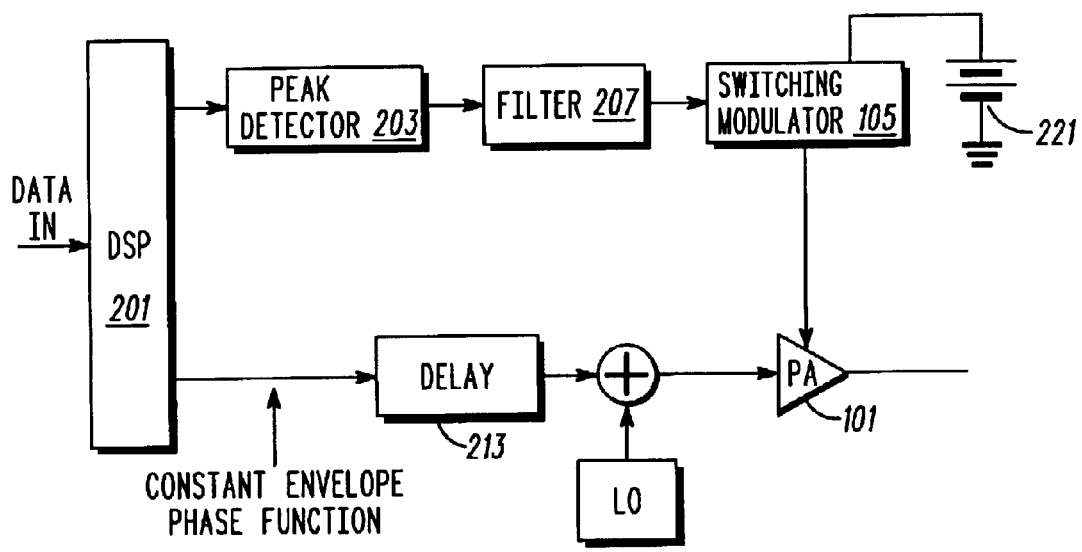
FIG. 2 is a block diagram of a power amplifier circuit in accordance with the preferred embodiment of the present invention.

Turning now to the drawings, wherein like numerals designate like components, FIG. 2 is a block diagram of power amplifier circuit 200 in accordance with the preferred embodiment of the present invention. In accordance with the preferred embodiment of the present invention peak detector 203 and filter 207 now precede switching modulator 105. Peak detector 203 serves as means to output a signal value that is the greater of the last K input samples. (For a single impulse this results in a sequence of K samples whose level is equal to the level of the single input impulse).

Additionally, filter 207 operates as a means for filtering with an impulse response that is K samples long, and whose coefficients are all greater than zero, and sum to unity.

Switching modulator 105 may be a Class D device, for example, or a switch-mode power supply (SMPS). Switching modulator 105 uses the output of filter 207 as its reference to efficiently transform a DC power source 221, as is known in the art, to a voltage that somewhat exceeds but that approximates the desired power amplifier 101 operating voltage level. That is, switching modulator 105 provides an efficient, but approximate, lower bandwidth envelope signal. Delay circuitry 213 serves to properly time align the RF power amplifier input signal with delayed, reduced bandwidth envelope supply voltage at PA 101.

Figure 3:
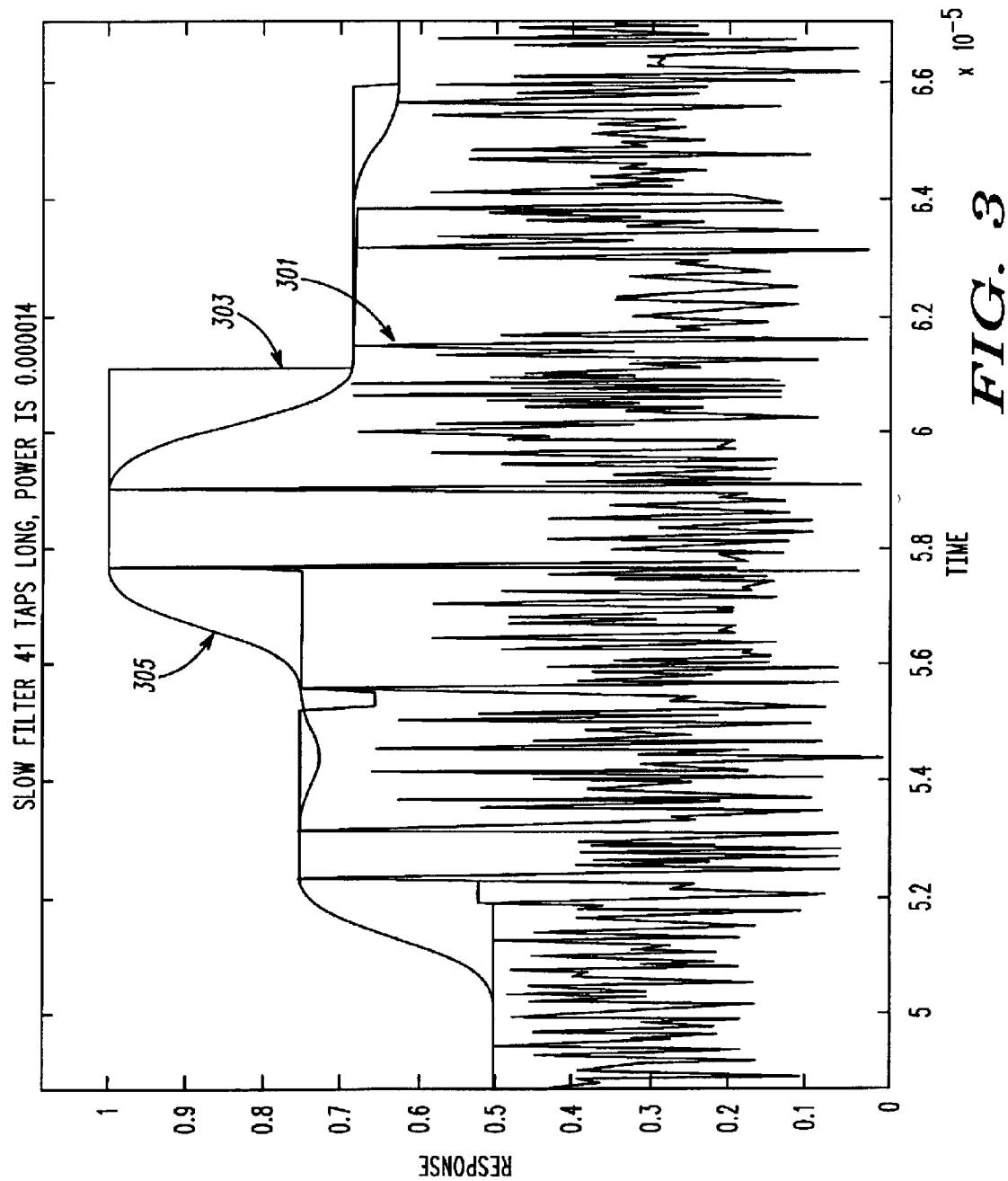
FIG. 3 is a graphical representation of the output of various elements within the power amplifier circuit of FIG. 2 in accordance with the preferred embodiment of the present invention.

Operation of circuitry 200 will be explained below with reference to FIG. 3. During operation, reference envelope signal 301 exits DSP 201 and is passed through peak detector 203. As discussed above, peak detector 203 serves to output a signal value that is the greater of the last K input samples. This results in square-wave signal 303 being output from peak detector 203. In order to "round out" signal 303, signal 303 enters filter 207 where it is filtered accordingly. More particularly, the filtering of signal 303 produces output 305 equal to the sum of $A_0S_0+A_1S_1+ \ldots +A_kS_k$ where $A_0$, $A_1, \ldots, A_k$ are filter coefficients and $S_0, S_1, \ldots, S_k$ are samples from square-wave signal 303. In the preferred embodiment of the present invention $A_0+A_1+ \ldots +A_k=1$. This assures that the instantaneous level of the filtered signal is greater than the unfiltered envelope signal at a particular point in time. The resulting output of filter 207 is then utilized by switching modulator 105.

As is evident, the resulting output from filter 207 is smaller than the signal bandwidth. This allows for efficient operation of switching modulator 105, even when envelope signal 301 operates at very high bandwidths.

Figure 4:
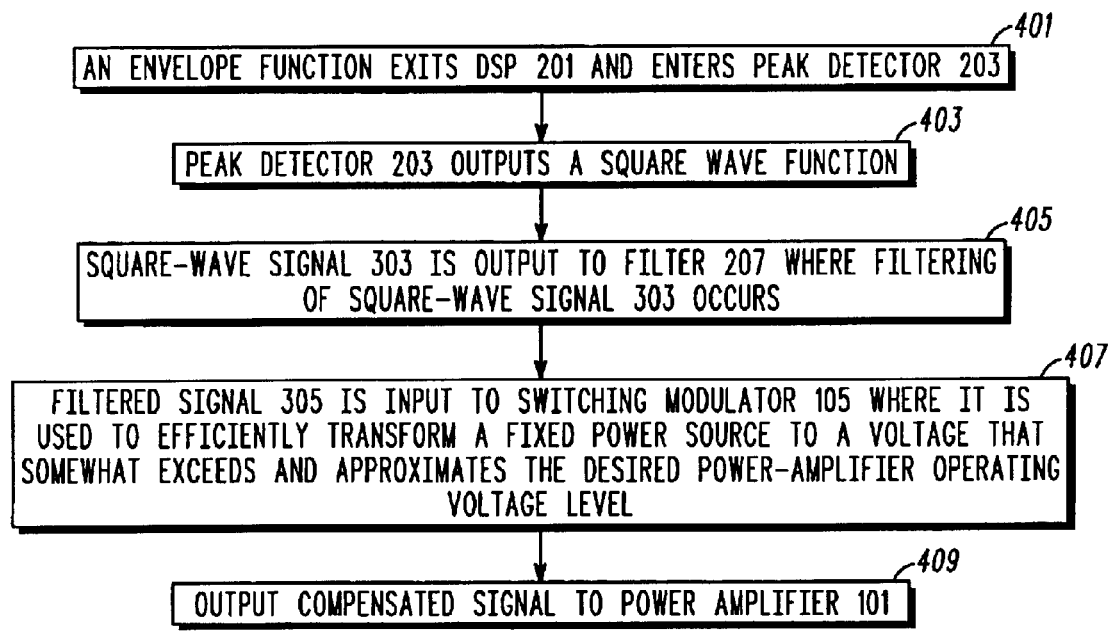
FIG. 4 is a flow chart showing operation of the power amplifier circuit of FIG. 2 in accordance with the preferred embodiment of the present invention.

FIG. 4 is a flow chart showing operation of power modulator 200 in accordance with the preferred embodiment of the present invention. The logic flow begins at step 401 where an envelope signal exits DSP 201 and enters peak detector 203. At step 403 peak detector 203 outputs a square wave signal. As discussed above, peak detector 203 outputs a square-wave signal 303 that at any point in time is the greater of the last K input samples, where in the preferred embodiment of the present invention K=11 or greater.

Continuing, at step 405 square-wave signal 303 is output to filter 207 where filtering of square-wave signal 303 occurs. As discussed above, filtering occurs to "round out" square wave 303. Additionally, square-wave signal 303 is filtered in such a way to assure that the instantaneous level of the filtered signal is greater than the unfiltered envelope signal at a particular point in time. At step 407 filtered signal 305 is input to switching modulator 105 where it is used to efficiently transform a fixed power source to a voltage that somewhat exceeds and approximates the desired power-amplifier operating voltage level. The approximate signal is then output to power amplifier 101 (step 409).

As discussed above, the output from filter 207 is smaller than the signal bandwidth. This allows switching modulator 105 to be utilized in high-speed communications systems, for example, those using orthogonal frequency division multiplexing (OFDM) modulation.

Figure 5:
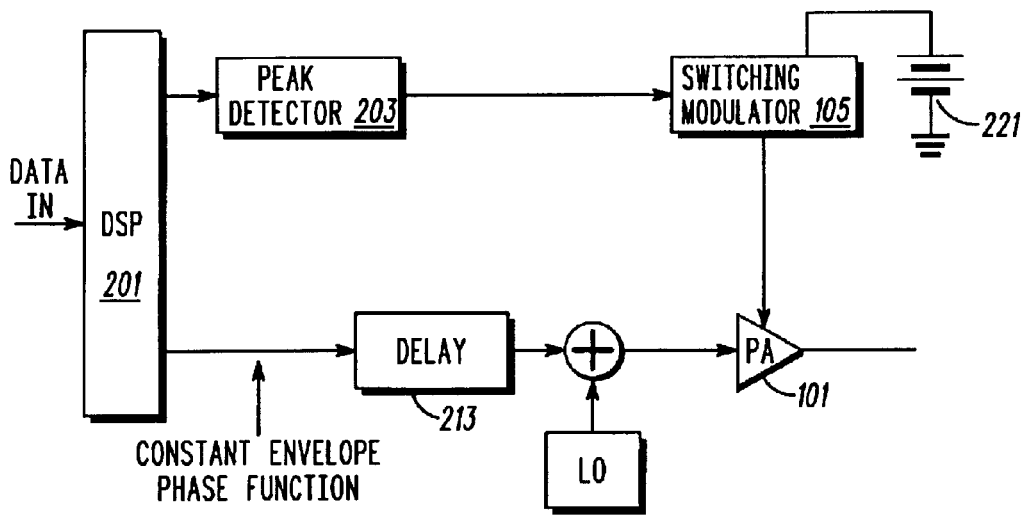
FIG. 5 is a block diagram of a power amplifier circuit in accordance with an alternate embodiment of the present invention.

FIG. 5 is a block diagram of a power amplifier circuit in accordance with an alternate embodiment of the present invention. As is evident, in the alternate embodiment of the present invention, filter 207 has been eliminated and the natural filtering response of the switched mode power supply 105 is utilized to filter the output of peak detector 203. During operation, reference envelope signal 301 exits DSP 201 and is passed through peak detector 203. As discussed above, peak detector 203 serves to output a signal value that is the greater of the last K input samples. This results in square-wave signal 303 being output from peak detector 203. The resulting output of peak detector 203 is then utilized by switching modulator 105.

While the invention has been particularly shown and described with reference to a particular embodiment, it will be understood by those skilled in the art that various changes in form and details may be made therein without departing from the spirit and scope of the invention. It is intended that such changes come within the scope of the following claims.

What is claimed is:

1. A method for operating a power modulator, the method comprising the steps of:

receiving an envelope signal and outputting a square wave signal as the greater of the last K samples of the envelope signal, wherein the step of receiving the envelope signal comprises the step of receiving the envelope signal in a peak detector and outputting the greater of the last K samples of the envelope signal from the peak detector;

filtering the square wave signal by outputting a sum of $A_0S_0+A_1S_1+ \ldots +A_kS_k$ where $A_0, A_1 \ldots, A_k$ are filter coefficients and $S_0, S_1, \ldots, S_k$ are samples from square-wave signal; and utilizing the filtered square wave to transform a fixed power source to a voltage that exceeds and approximates a desired power-amplifier operating voltage level.

2. The mothod of claim 1 wherein the step of utilizing the filtered square wave to transform the fixed power source to the voltage that exceeds and approximates the desired power-amplifier operating voltage level comprises the step of utilizing a switching modulator and the filtered square wave to transform the fixed power source to the voltage that exceeds and approximates the desired power-amplifier operating voltage level.

3. The method of claim 2 wherein the step of utilizing the switching modulator comprises the step of utilizing a Class D device, or a switch-mode power supply (SMPS) to receive the filtered square wave and to transform the fixed power source to the voltage that exceeds and approximates the desired power-amplifier operating voltage level.

4. A power modulator comprising:

a peak detector having an envelope function as an input and outputting a square wave signal based on the envelope function;

a filter having the square wave signal as an input and outputting a filtered square wave signal comprising a sum of $A_0S_0+A_1S_1+, \ldots +A_1S_k$ where $A_0, A_1, \ldots, A_k$ are filter coefficients and $S_0, S_1, \ldots, S_k$ are samples from square-wave signal; and a switching modulator having the filtered square wave signal as an input and outputting a voltage, based on the filtered square wave signal, wherein the voltage exceeds and approximates a desired power-amplifier g voltage.

5. The power modulator of claim 4 wherein the peak detector outputs the greater of the last K input samples of the envelope function.

6. The power modulator of claim 4 wherein the switching modulator comprises a Class D device or a switch-mode power supply (SMPS).

7. An apparatus comprising:

a peak detector for receiving an envelope signal outputting a square wave signal as the greater of the last K samples of the envelope signal;

means for filtering the square wave signal by outputting a sum of $A_0S_0+A_1S_1+\ldots+A_kS_k$ where $A_0, A_1, \ldots, A_k$ are filter coefficients and $S_0, S_1, \ldots, S_k$ are samples from square-wave signal; and means for utilizing the filtered square wave to trans a fixed power source to a voltage that exceeds and approximates a desired power-amplifier operating voltage level.

8. The apparatus of claim 7 wherein the means for receiving comprising a peak detector.

9. The apparatus of claim 7 wherein the means for utilizing the filtered square wave comprises a switching modulator.

10. The apparatus of claim 9 wherein the switching modulator comprises a Class D device or a switch-mode power supply (SMPS).

* * * * *